(12) United States Patent
Nielsen et al.

(10) Patent No.: US 6,194,970 B1
(45) Date of Patent: Feb. 27, 2001

(54) OSCILLATOR STABILITY MONITORING AND COMPENSATION SYSTEM

(75) Inventors: Jorgen S. Nielsen; Richard Kerslake, both of Calgary (CA)

(73) Assignee: Nortel Networks Corporation, Montreal (CA)

( * ) Notice: Subject to any disclaimer, the term of this patent is extended or adjusted under 35 U.S.C. 154(b) by 0 days.

(21) Appl. No.: 09/377,254

(22) Filed: Aug. 19, 1999

(51) Int. Cl.[7] .................................................. H03L 7/14
(52) U.S. Cl. ......................... 331/16; 17/25; 17/44
(58) Field of Search ............................ 331/44, 17, 16, 331/25

(56) References Cited

U.S. PATENT DOCUMENTS 5,028,885 * 7/1991 Voigt et al. ........................ 331/25
5,473,284 * 12/1995 Jantti et al. ........................ 331/10
5,473,640 * 12/1995 Bortolini et al. .................. 331/18

* cited by examiner

Primary Examiner—Siegfried H. Grimm
(74) Attorney, Agent, or Firm—Schwegman, Lundberg, Woessner & Kluth, P.A.

(57) ABSTRACT

The invention includes analyzing the steering voltage applied to a crystal oscillator over time, and compensating for spurious frequency jumps in determining the drift rate of a crystal oscillator. The steering voltage may be used to estimate oscillator stability by comparing a projected steering voltage against an actual voltage after a simulated holdover period, or analyzing a steering voltage recorded over a period of time and evaluating rates of change. Spurious frequency jumps may be removed from data collected while not in an actual holdover, making the data more accurately represent the frequency drift rate of the oscillator. Also, the rate of occurrence of spurious frequency jumps while not in holdover may be monitored to provide information regarding the physical condition of the crystal.

21 Claims, 3 Drawing Sheets

OSCILLATOR STABILITY MONITORING AND COMPENSATION SYSTEM

FIELD OF THE INVENTION

The invention relates generally to electronic oscillator stability, and more particularly to oscillator stability monitoring and compensation in a Code Division Multiple Access (CDMA) cellular telephone base station.

BACKGROUND OF THE INVENTION

Mobile telephone systems have evolved over time from the simple radiotelephone systems of the 1970s to complex multiplexed digital systems which are now becoming standard. Such changes represent a need to handle growing numbers of cellular phone users as well as improvements in technology and reductions in cost of electronic mobile phone equipment. But, as technology and use of mobile phones increases, the frequency spectrum available for electronic wireless communication remains fixed and so necessitates increasingly efficient use of what frequency bandwidth is available for mobile phone systems.

In a cellular phone system where frequencies within the allotted frequency band are reused in cells not physically adjacent to each other, capacity to handle additional calls can be increased by simply adding more cells in a geographic area. But, technical problems and costs associated with very dense cell population make solutions based on more efficient use of bandwidth a more cost-effective and practical option. The CDMA wireless phone system is one example of a solution that allows multiple cellular phone users to share the same frequency spectrum, and uses a generated noise carrier with a different and essentially orthogonal instance of the noise carrier assigned to each mobile unit within a cell. The base station receiver in a CDMA station correlates the received signal from a mobile unit with the desired noise carrier, extracting the transmitted digital signal with a sufficient signal-to-noise ratio to achieve a satisfactory data error rate.

But, because the base stations in a system such as cDMA must be synchronized with surrounding base stations to handle handoff of mobile phones between cells and for other functions, a time reference must be provided to each base station. This is commonly provided via Global Positioning System (GPS) receivers which comprise a part of each base station. GPS satellites each provide radio signals that are synchronized and usable by GPS receivers not only to derive one's physical position relative to the satellites but also to derive a very accurate time reference.

But, because the GPS receiver antennas of cellular phone equipment are often placed high relative to surrounding terrain, they are subject to lightning damage in addition to physical damage from rough handling or other damage. CDMA base stations which lose contact with GPS satellites should ideally continue to operate during this holdover period until contact can be reestablished, whether through repair of damaged equipment, or other changed circumstances. A crystal oscillator may provide a time reference during this holdover period, as long as the oscillator is stable enough to keep the base station sufficiently synchronized with other base stations.

Crystal oscillators in base stations used to provide a holdover time reference are often tested before placement in the field by monitoring timing stability during a pre-deployment test that typically lasts two days or less. Unfortunately, some crystals do not become stable in frequency or settle in until several weeks of operation have passed, and once settled in may prove to be too inaccurate or unstable to provide an adequate time reference during a holdover period. As crystals age they also tend to drift in frequency, and the frequency change again becomes more rapid as crystals begin to fail. A method of testing crystals after a longer period of operation is needed, as is a method of compensating for frequency change in a crystal over time.

SUMMARY OF THE INVENTION

The invention provides a method and an apparatus to perform holdover stability testing of an oscillator in service, including the ability to detect and compensate for spurious frequency jumps. One embodiment provides holdover testing for a CDMA base station, to predict the ability of a crystal oscillator to serve as a clock signal source in the event of a reference clock signal loss. The holdover testing method of one embodiment comprises characterizing the oscillator stability relative to a system reference clock. The oscillator is then operated independent of the system reference clock and compensated consistent with the oscillator characterization. Finally, the oscillator clock is compared to the system clock to derive a holdover error.

DETAILED DESCRIPTION

Figure 1:
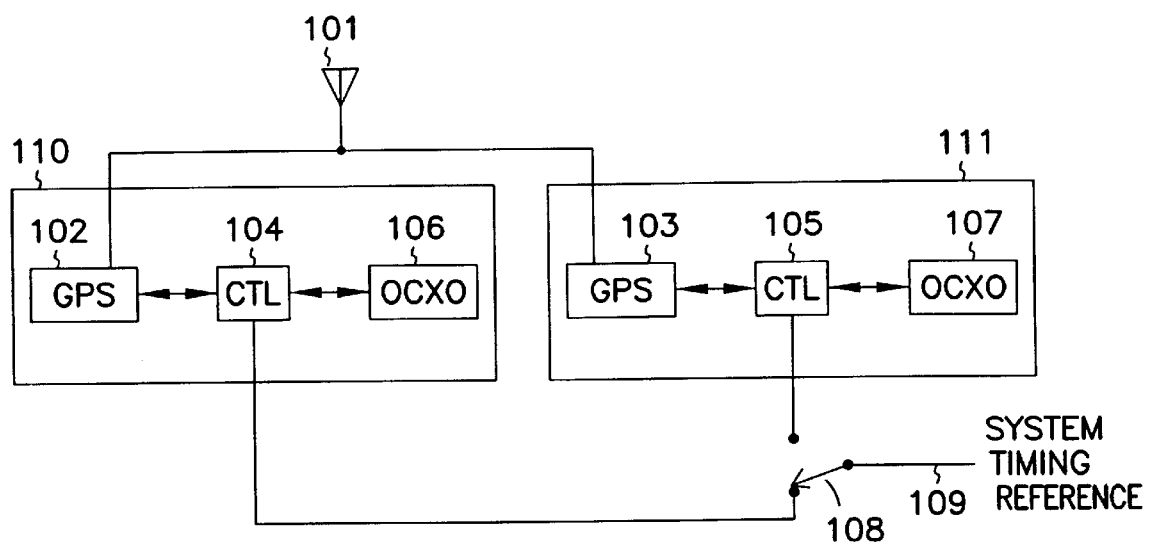
FIG. 1 shows a block diagram of a CDMA base station clock generating module, consistent with an embodiment of the present invention.

In the following detailed description of sample embodiments of the invention, reference is made to the accompanying drawings which form a part hereof, and in which is shown by way of illustration specific sample embodiments in which the invention may be practiced. These embodiments are described in sufficient detail to enable those skilled in the art to practice the invention, and it is to be understood that other embodiments may be utilized and that logical, mechanical, electrical, and other changes may be made without departing from the spirit or scope of the present invention. The following detailed description is, therefore, not to be taken in a limiting sense, and the scope of the invention is defined only by the appended claims.

A method is needed for improving on the performance of current CDMA base station clock stability when the base station is not receiving a GPS signal to provide a clock reference. When no GPS signal is received the system clock operates in holdover mode, and the clock signal is generated by a crystal oscillator designed to provide a signal of the same frequency as is provided by the GPS receiver. The present invention improves on current GPS-based clock stability during holdover by better estimating and compensating for the performance of a crystal used to generate a clock signal during this holdover period. It further is capable of detecting spurious frequency jumps in the crystal, and compensating for these jumps in characterizing the performance of the crystal. This invention provides solutions to these and other problems, and is described in detail below.

A typical CDMA base station uses a received GPS signal to produce a reference clock signal to ensure that CDMA stations are synchronized in operation. Such synchronization between stations is important to the proper operation of a CDMA system, as common operations such as a CDMA spread spectrum code search and station-to-station handoff require that stations be closely synchronized. Mobile stations also synchronize to the signals provided by the base station, such that the GPS clock provides a timing reference for both the base station and all mobile stations active within the cell.

This synchronization is jeopardized when the base station fails to receive a GPS signal, and must rely on an oscillator to maintain time independent of the GPS signal still used by neighboring base stations. This commonly occurs as a result of lightning strikes that damage the GPS antenna or receiver of a CDMA system, and also occurs as a result of damage due to rough handling and vandalism or from other causes. If the oscillator is not sufficiently stable, the time it provides to the base station may drift with respect to the desired GPS reference time, and cause the base station to fail to communicate properly.

Currently, a new oven-controlled crystal oscillator (OCXO) used to provide a holdover clock signal in a CDMA system is burned in and tested in operation for frequency stability for no more than a few days. Crystals that perform adequately are then accepted for service and placed in use as part of a CDMA base station. But, because crystals often take from 20 to 30 days to settle in or become stable in performance, this test cannot ensure performance of the crystal in extended operation. Excessive frequency drift due to molecular settling or spurious frequency jumps due to contaminants in the crystal may cause the crystal to perform much more poorly in the field than these preliminary tests could indicate. Other factors such as rough handling during installation or spurious mechanical changes in the crystal may further degrade crystal stability, and are not detectable after initial testing.

FIG. 1 is a block diagram of components that are typical of those currently used to provide a clock signal in a CDMA base station. An antenna 101 is connected to a GPS receiver 102 and a redundant GPS receiver 103, which are respectively a part of a clock generator 110 or redundant clock generator 111. Each GPS receiver is connected to a controller 104 or 105 that changes the clock signal source from the GPS receiver to an oven-controlled crystal oscillator 106 or 107 during holdover periods. A switch 108 allows switching between main clock generator 110 and redundant clock generator 111 to provide system timing reference signal 109.

In normal operation, the timing signal from the GPS receiver 102 is received by controller 104, where it is routed to a digital processor. The processor incorporates a Phase-Locked Loop (PLL) that closely tracks the GPS-generated time signal and produces a digital voltage signal that is routed to a Digital-to-Analog Converter (DAC), which provides an analog steering voltage to the oscillator 106. The output from the oscillator is routed to a frequency divider and phase detector within the controller 104, and the output from the phase detector is fed back to the digital processor. The processor monitors the phase detector to adjust the output to the DAC, so that the phase difference between the timing signal from the GPS receiver and the crystal oscillator feedback is minimized. This feedback system therefore steers the crystal oscillator frequency to match the clock signal provided by the GPS receiver.

The system timing reference 109 is provided by the GPS receiver 102 during normal operation, and the controller 104 and oscillator 106 track the clock signal provided by the GPS receiver. Only when both the main clock generator 110 and the redundant clock generator 111 lose the GPS signal, such as would happen as a result of loss of the antenna 101, does the crystal oscillator of either the main or redundant clock generator provide the system clock signal.

Figure 2:
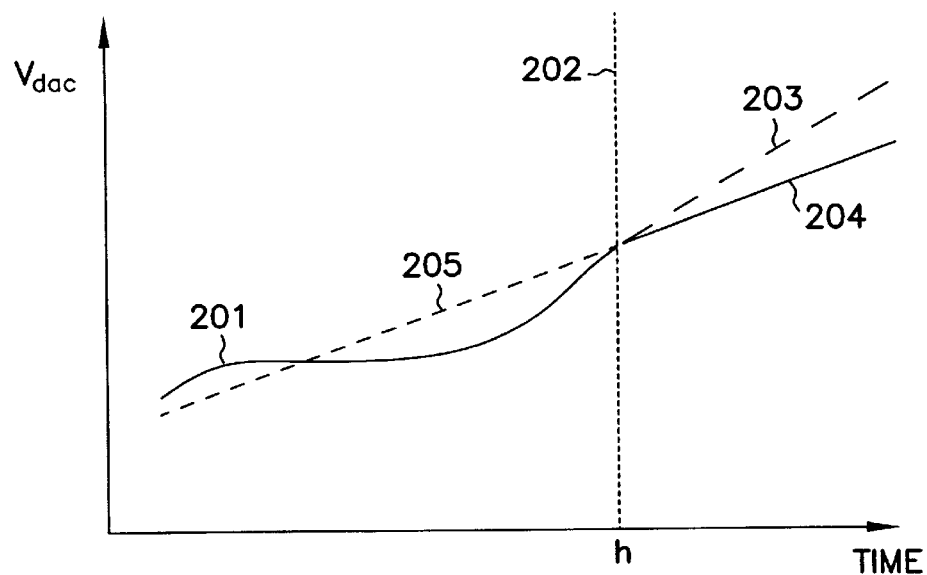
FIG. 2 shows a graph of oscillator steering voltage Vdac versus time, consistent with an embodiment of the present invention.

When the GPS signal is lost, the controller 104 calculates a voltage by extrapolation to apply to the crystal oscillator based on a linear approximation of past voltage applied to the oscillator over the time the GPS signal was used as a reference. FIG. 2 illustrates how the voltage Vdac generated by the DAC (Y-axis) may vary with respect to time (X-axis), both before and after a GPS signal is lost. Line 201 represents a DAC voltage as might be applied to the crystal during normal operation to correct the oscillating frequency to match the clock signal generated by the GPS receiver. At time 'h', represented by dashed line 202, the GPS signal is lost and the crystal oscillator provides the system clock. From this time forward, the voltage Vdac is estimated based on past characterization of the past voltage applied to the crystal over time.

Dashed line 203 shows a Vdac voltage that varies in time based on the rate at which Vdac varied in time at the time the GPS signal was lost, but ignores the rate at which Vdac has previously changed with respect to time. Solid line 204 shows a Vdac voltage that varies with respect to time and that is an extrapolation of a linear approximation of the past Vdac voltage over a period of time. Dashed line 205 shows a linear approximation of Vdac over time during the period when the GPS signal was used as a reference, and solid line 204 is simply an extrapolation of that line after time 'h', at which the GPS signal is lost.

But, the exact timing required by CDMA systems has led to a holdover performance requirement that oscillator timing error is less than seven microseconds in error after 24 hours of holdover, which is a frequency error of less than one part in twelve billion. Such a low error rate is only attainable, even when compensating for error using linear approximation as shown in FIG. 2, if the crystal oscillator is sufficiently stable. Because crystal oscillators often have only several days of operating time before deployment and have often not yet settled, such performance cannot be ensured using current pre-deployment testing.

The present invention provides a method and apparatus for characterizing the stability of the oscillator, by monitoring both its frequency stability and susceptibility to spurious frequency jumps with respect to the GPS reference signal. Because the invention allows repeated testing of the crystal in operation, crystals that fail to perform adequately may be more accurately identified and removed from service.

The invention includes analyzing the steering voltage applied to a crystal oscillator over time, and compensating for spurious frequency jumps in determining the drift rate of a crystal oscillator. The steering voltage may be used to estimate oscillator stability by comparing a projected steering voltage against an actual voltage after a simulated holdover period, or analyzing a steering voltage recorded over a period of time and evaluating rates of change. Spurious frequency jumps may be removed from data collected while not in an actual holdover, making the data more accurately represent the frequency drift rate of the oscillator.

Also, the rate of occurrence of spurious frequency jumps while not in holdover may be monitored to provide information regarding the physical condition of the crystal.

Figure 3:
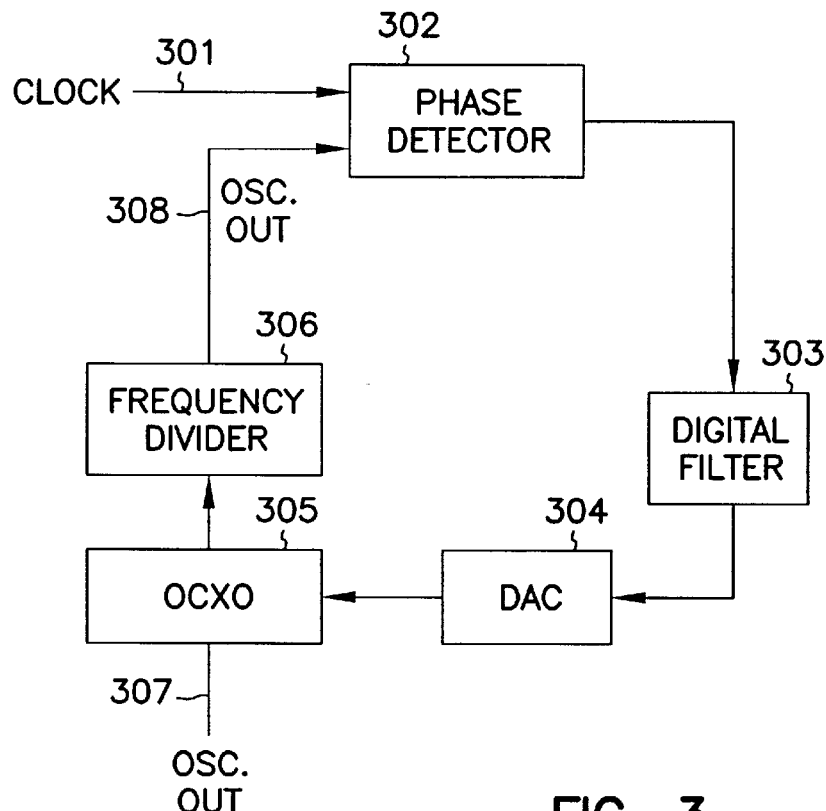
FIG. 3 shows an oscillator block diagram, consistent with an embodiment of the present invention.

FIG. 3 illustrates one hardware embodiment operable to practice the invention. A reference clock signal 301 such as a GPS time reference is provided to a phase detector 302. The output of the phase detector is connected to a digital filter 303, the output of which is sent to a digital-to-analog converter (DAC) 304. The output voltage generated by the DAC 304 is routed to an oscillator, such as an oven-controlled oscillator 305. An output signal from the oscillator is provided as an oscillator output 307, that can be used as a system clock signal during holdover periods. Alternately, the output from a frequency divider 306 can be provided as an oscillator circuit output and used as a system clock. Finally, the oscillator sends an output signal to the frequency divider 306, which in turn produces an output signal that is connected to the phase detector 302.

In operation, the phase detector 302 compares the output of the crystal oscillator 305 as filtered by the frequency divider 306 to the clock reference signal 301. The output of the phase detector is connected to the digital filter 303, and represents the difference in phase between the filtered oscillator output and the reference clock signal. The digital filter 303 in one embodiment is implemented in a microprocessor and is further capable of storing data and performing other functions. The digital filter calculates a steering voltage to be provided to the oscillator 305 such that the phase difference between the frequency-divided oscillator and the clock reference signal is minimized, and provides a digital representation of this value to the DAC 304. The DAC 304 converts the digital signal into an analog steering voltage that is provided to the oscillator 305. The oscillator oscillates at a frequency that is a multiple of the input clock 301, and so its output is divided at frequency divider 306 before routing to the phase detector 302.

The oscillator 305 therefore is controlled by the output of the digital filter 303 such that the phase difference between the reference clock signal and the divided signal from the oscillator is minimized, causing the oscillator to oscillate at and track some multiple of the reference clock signal's frequency. This is the normal mode of operation for the system when connected to a valid clock reference signal 301, such as when a clock reference signal is provided by a GPS receiver. When this reference signal is lost, the oscillator must continue to operate, and to approximate as closely as possible the lost reference clock signal.

To do this, the oscillator circuit of FIG. 3 characterizes the performance of the oscillator while the reference clock signal is available, and uses this data to monitor and compensate for instability of the oscillator 305. This invention characterizes the steering voltage signal computed by the digital filter 303, and uses this characterization to provide a more accurate steering voltage signal to the oscillator when disconnected from the reference clock signal. Also, spurious frequency jumps such as are caused by physical changes in the crystal are detected, and are compensated for in characterizing the steering voltage signal produced while the oscillator circuit of FIG. 3 is tracking a valid reference clock signal.

Figure 4:
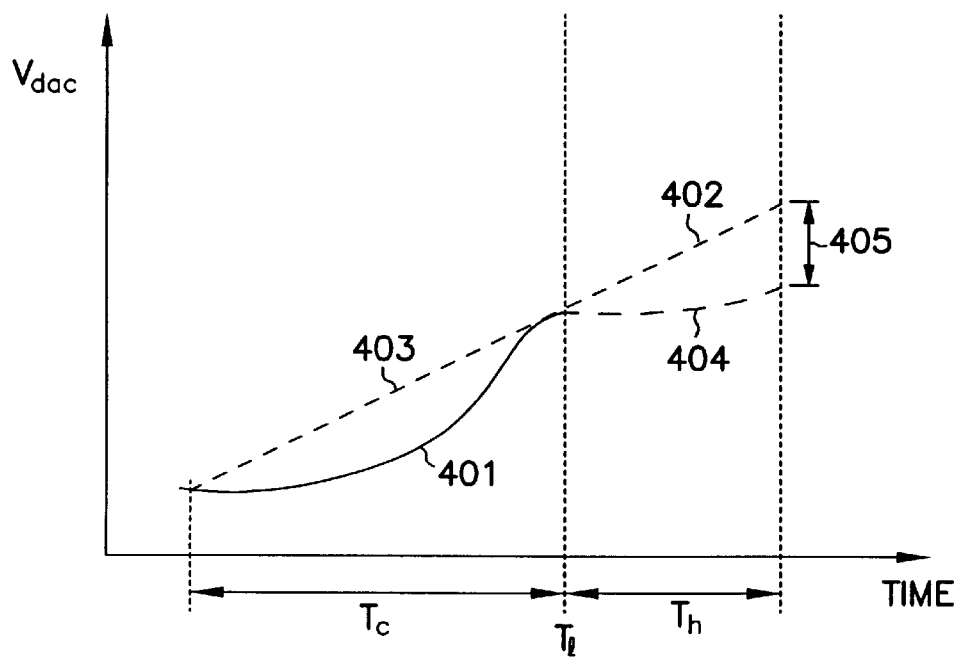
FIG. 4 shows a graph of the oscillator steering voltage Vdac versus time, consistent with an embodiment of the present invention.

FIG. 4 illustrates one embodiment's characterization of an exemplary steering voltage signal, and how it is characterized both to monitor oscillator stability and to improve holdover performance. Time period Tc represents a time period during which the reference clock signal is connected to the oscillator circuit of FIG. 3, and comparison can be made between the oscillator and the reference clock signal. The Y-axis of the graph of FIG. 4 shows Vdac, a variable that represents the steering signal output from the digital filter 303 of FIG. 3. During the time period Tc, the solid line 401 indicates the actual steering signal output from the digital filter. This steering signal is the steering signal produced to track the reference clock signal, and is in effect a training time interval. At time T1, the reference clock signal is lost, and the oscillator circuit enters holdover mode in which the oscillator must produce the system clock signal. During the holdover time period Th, the digital filter continues to produce a Vdac voltage curve 402 that is an approximation of the Vdac curve 401 observed before loss of the reference clock signal. Here, curve 402 is a continuation of a linear approximation of curve 401, where the linear approximation curve is shown as 403 for the time period Tc before loss of the reference clock signal.

The linear approximation in one embodiment is a least-squares approximation curve. A least-squares approximation seeks to minimize the sum of the squared differences between the actual steering data 401 to the curve-fit steering data 403. Therefore, the data points on the curve with larger error are given greater weight in deriving a least-squares approximation, seeking to minimize both the occurrence and magnitude of error. In another embodiment, second-order or other high-order polynomial curves may be used to characterized the Vdac steering voltage, but low-order polynomials or linear curves are preferred.

The holdover performance of the crystal oscillator is estimated as described herein in reference to FIG. 4, which shows exemplary curves consistent with the operation of one embodiment of the present invention. The reference clock signal from the GPS is present, valid, and is used to steer the crystal oscillator during both time epochs Tc and Th. Therefore, the steering voltage applied to the crystal oscillator during Tc is as shown by the exemplary curve 401 and the steering voltage applied during Th is as shown in the exemplary curve 404. The curve 403 is a least-squares curve fit to 401 over the period Tc that is extrapolated into Th as shown by curve 402. The integrated difference between the curves 402 and 404 is proportional to the timing error that would occur had the crystal oscillator actually been in holdover mode during the time period Th. This holdover error value can be monitored to ensure that it falls within performance requirements, and can be tracked over time for trends that may indicate the oscillator is becoming less stable.

Figure 5:
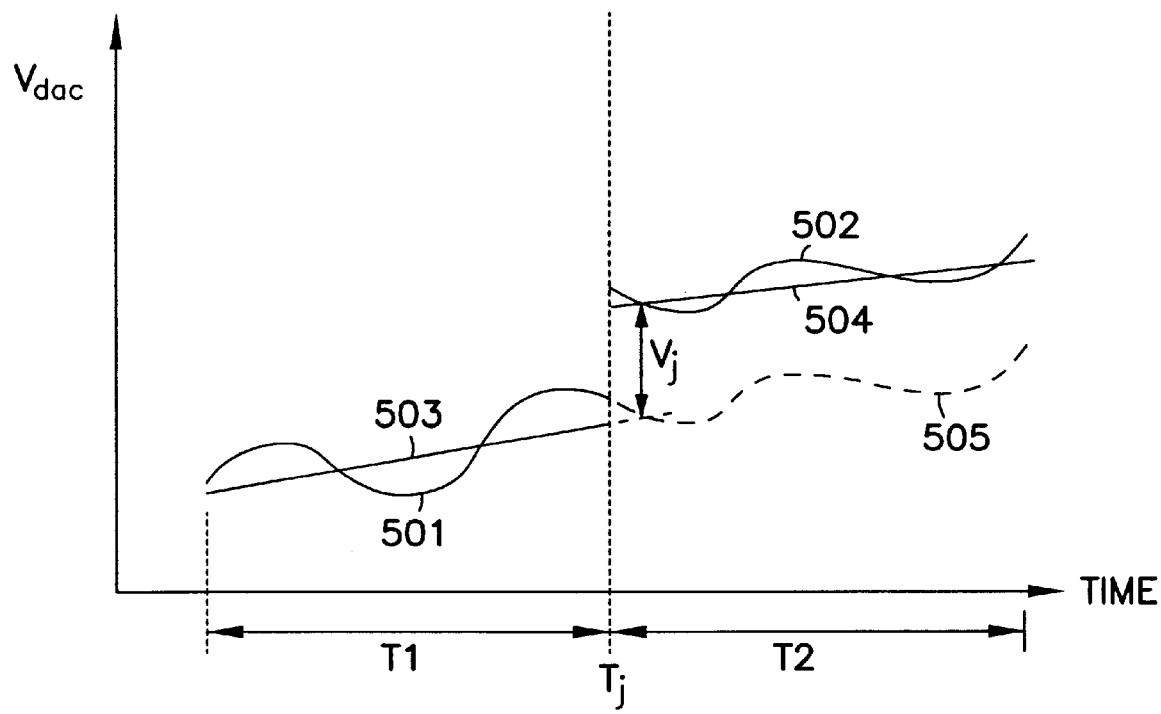
FIG. 5 shows a graph of the oscillator steering voltage Vdac versus time during a a spurious frequency jump occurrence, consistent with an embodiment of the present invention.

As mentioned earlier, spurious frequency jumps may occur in the oscillator 305, due to physical damage or stress, or because of other physical changes in the oscillator device. These sudden changes in frequency can be detected by the digital filter, and can also be characterized over time and compensated for in performing other oscillator circuit functions. FIG. 5 illustrates exemplary curves that are here used to illustrate the operation of one embodiment of the present invention. The steering voltage Vdac shown by curve 501 during time period T1 is the steering voltage prior to the time Tj The time period after the occurrence of the frequency jump is shown as time period T2. Curve 502 is the steering voltage that would occur during this time period. Curve 504 is the curve fit of steering voltage 502 during time period T2. The voltage difference Vj between 503 and 504 at time Tj can be used to estimate the relative magnitude of the frequency jump. The extent of T1 and T2 is optimized to give the best estimate of the actual frequency jump in a further embodiment.

Once the voltage jump Vj is estimated, the steering curve 502 is corrected by subtracting Vj such that it appears as corrected curve 505. The composite of the steering curves 501 and 505 can now be used to obtain a more accurate estimate of the drift of the crystal oscillator. If spurious frequency jumps were not removed from the recorded steering voltage used to characterize the crystal's stability, the jumps would be factored in to the linear approximation curve 403 and so affect the holdover performance of the oscillator circuit. Because the occurrence of spurious frequency jumps is not regular or predictable, they are not compensated for during holdover periods.

These spurious frequency jumps are therefore removed from data used to characterize the oscillator, including all data from holdover stability tests, to eliminate their influence on these measurements. But during periods of actual holdover when the reference clock signal is lost, a single oscillator circuit such as the one shown in FIG. 3 cannot monitor for spurious frequency jumps and so is susceptible to these frequency jumps. Furthermore, the redundant oscillator circuit 106 or 107 as shown in FIG. 1 cannot be used as a reference, because no mechanism exists to determine which oscillator is the source of the spurious frequency jump. Addition of a third oscillator would allow detection and compensation for such jumps, and may be desirable in some applications. In any hardware configuration, the rate and magnitude of spurious frequency jumps is important to the holdover stability of such an oscillator circuit, and so are monitored and tracked.

The rate of occurrence of spurious frequency jumps is monitored in part to detect an oscillator crystal that is physically deteriorating. If the occurrence of such jumps accelerates over a period of time after the crystal has settled in, it may be due to physical deterioration of the crystal and be an indicator of decreasing oscillator stability. But, new crystals are expected to show a decrease in spurious frequency jumps as they settle in, and so may be monitored to ensure they be come suitably stable during the settling in process. A threshold acceptability rate of spurious frequency jump magnitude and frequency may be determined and used to screen crystal oscillators in the field for replacement.

Similarly, the Vdac error 405 resulting from holdover performance testing may be logged and compared over time, so that increasing error rates may be used to indicate a crystal that is deteriorating and may require replacement. Threshold acceptability rates for frequency drift and for Vdac error during holdover performance testing may also be set, and used to screen crystal oscillators in operating base stations for replacement.

This invention provides both a means of in-field testing of holdover stability performance and characterization of the rate of deterioration of a crystal in operation. It provides a holdover stability characterization and tracking function and circuit, and has the ability to detect and compensate for spurious frequency jumps in characterizing frequency drift. The invention can also monitor the rate and magnitude of spurious frequency jumps over time, as well as the rate of oscillator frequency drift or holdover performance error over time, to ensure adequate performance and to characterize the rate at which a crystal oscillator is becoming unstable.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the invention. It is intended that this invention be limited only by the claims, and the full scope of equivalents thereof.

We claim:

1. A method of testing stability of an oscillator, comprising:

characterizing oscillator stability relative to a system reference clock;

operating the oscillator independent of the system reference clock for a period of time to simulate holdover;

deriving a holdover error that is the difference between the system reference clock and the oscillator over the period of time;

detecting spurious frequency jumps in the oscillator while characterizing the oscillator stability; and compensating for the spurious frequency jumps in characterizing the oscillator stability.

2. The method of claim 1, wherein characterizing oscillator stability relative to a system reference clock comprises characterizing an oscillator steering voltage over time.

3. The method of claim 2, further comprising:

detecting spurious frequency jumps while characterizing an oscillator steering voltage; and compensating for the spurious frequency jumps in characterizing the oscillator steering voltage.

4. The method of claim 1, further comprising:

detecting spurious frequency jumps in operating the oscillator independent of the reference clock; and compensating for the spurious frequency jumps in calculating the holdover oscillator error.

5. The method of claim 2, wherein operating the oscillator independent of the reference clock signal for a period of time further comprises providing a steering voltage to the oscillator that is extrapolated from the characterization of the oscillator steering voltage over time.

6. A method of testing stability of an oscillator, comprising:

tracking an oscillator clock steering voltage over a simulated holdover period of time; and calculating a predicted holdover oscillator error from the tracked oscillator clock steering voltage.

7. The method of claim 6, wherein calculating a predicted holdover oscillator error further comprises evaluating a rate of change of the oscillator clock steering voltage over time.

8. The method of claim 6, further comprising:

detecting spurious frequency jumps during the simulated holdover period of time; and compensating for the spurious frequency jumps in calculating the predicted holdover oscillator error.

9. A method of detecting deterioration of a crystal oscillator, comprising:

testing the stability of the crystal oscillator relative to a reference clock signal periodically;

storing the results of the periodic tests; and comparing the results of the periodic tests over time.

10. The method of claim 9, wherein comparing the results of the periodic tests comprises calculating whether the oscillator is becoming more stable or less stable over time.

11. The method of claim 10, wherein comparing the results of the periodic tests further comprises calculating whether the rate at which the oscillator is changing in stability is increasing or decreasing.

12. The method of claim 9, wherein comparing the results of the periodic tests comprises calculating whether the rate at which the oscillator is changing in stability is increasing or decreasing.

13. A clock module, comprising:

an oscillator that produces an oscillator clock signal;

a controller that is operable to characterize the oscillator stability relative to a reference clock signal by operating the oscillator independent of the reference clock signal for a period of time and further by calculating an holdover oscillator error that is the difference between the oscillator clock signal change and the reference clock signal change over the period of time, and that is further operable to compensate for the holdover oscillator error in controlling the oscillator.

14. The clock module of claim 13, wherein the controller is further operable to detect spurious frequency jumps and to compensate for the spurious frequency jumps in the oscillator while characterizing the oscillator stability.

15. The clock module of claim 13, further comprising a tracking module that is operable to track a difference between the reference clock signal and the oscillator clock signal.

16. The clock module of claim 15, wherein the tracking module comprises a phase detector.

17. The clock module of claim 16, wherein the tracking module further comprises a frequency divider.

18. An oscillator module, comprising:

a reference clock signal source;

a phase detector connected to the reference clock signal source and an oscillator, and further operable to detect a phase difference between the reference clock signal and an oscillator signal;

a filter connected to an output of the phase detector that provides a steering voltage signal to the oscillator to cause the oscillator signal to track the reference clock signal source; and a controller that operates the oscillator independent of the reference clock signal with a predicted steering voltage for a simulated holdover period of time, and that further calculates a predicted holdover error that is the difference between the oscillator signal and the reference clock signal at the end of the simulated holdover period of time.

19. The oscillator module of claim 18, wherein the filter and the controller are implemented in a Digital Signal Processor (DSP).

20. The oscillator module of claim 18, wherein the controller is further operable to detect spurious frequency jumps and to compensate for the spurious frequency jumps in tracking the steering voltage.

21. A method of providing accurate timing signals when a reference timing signal is unavailable, the method comprising:

correcting an oscillator in accordance with the reference timing signal when such signal is available;

characterizing the oscillator based on a difference between the reference timing signal and an oscillator output signal;

compensating for spurious frequency jumps while characterizing the oscillator; and operating the oscillator in accordance with the characterization when the reference timing signals are not available.

* * * * *